(12) United States Patent
Kim et al.

(10) Patent No.: US 9,960,532 B2
(45) Date of Patent: *May 1, 2018

(54) THIN FILM TYPE MAGNETIC CONNECTOR MODULE

(71) Applicant: SPS Inc., Daejeon (KR)

(72) Inventors: Hyun-Jun Kim, Daejeon (KR); Dae-Young Youn, Seoul (KR); Sang-Min Kim, Daejeon (KR); Jung Gyo Kim, Daejeon (KR); Seung-Ju Jeong, Daejeon (KR)

(73) Assignee: SPS Inc., Daejeon (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/483,487

(22) Filed: Apr. 10, 2017

(65) Prior Publication Data

US 2017/0214176 A1    Jul. 27, 2017

Related U.S. Application Data

(63) Continuation of application No. 14/948,724, filed on Nov. 23, 2015, now Pat. No. 9,620,893.

(30) Foreign Application Priority Data

Nov. 25, 2014  (KR) .................. 20-2014-0008618 U

(51) Int. Cl.
  *H01R 13/60*  (2006.01)
  *H01R 13/62*  (2006.01)
  *H01R 12/71*  (2011.01)
  *H05K 1/11*  (2006.01)

(52) U.S. Cl.
  CPC ....... *H01R 13/6205* (2013.01); *H01R 12/714* (2013.01); *H05K 1/116* (2013.01)

(58) Field of Classification Search
  CPC ........................ H01R 13/6205; H01R 13/7031
  See application file for complete search history.

(56) References Cited

U.S. PATENT DOCUMENTS

| 3,521,216 | A | 7/1970 | Tolegian |
| 3,588,255 | A | 1/1971 | Nicastro |
| 3,808,577 | A | 4/1974 | Mathauser |

(Continued)

OTHER PUBLICATIONS

International Search Report and Written Opinion issued in Application No. PCT/US15/62522 dated Mar. 24, 2016.

*Primary Examiner* — Xuong Chung Trans
(74) *Attorney, Agent, or Firm* — Knobbe, Martens, Olson & Bear LLP

(57) ABSTRACT

Various disclosed embodiments generally relate to connector modules, and more particularly to magnetic connector modules. The connector module includes a board having a concave section formed at a first side, and the concave section has a base surface having formed thereon a plurality of first electrodes. A plurality of second electrodes are formed at a second side of the board opposite the first side and on a rear surface facing away from the base surface. A plurality of holes are formed through the concave section and have conductors formed therethrough to electrically connect the first electrodes and the second electrodes. The connector module additionally includes a magnet inserted into the concave section and an insulating layer interposed between the magnet and the first electrodes.

19 Claims, 8 Drawing Sheets

(56) References Cited

U.S. PATENT DOCUMENTS

| | | | |
|---|---|---|---|
| 5,210,940 A | 5/1993 | Kawakami et al. | |
| 8,755,851 B2 | 6/2014 | Kim et al. | |
| 8,894,419 B1 * | 11/2014 | Buelow | H01R 13/6205 |
| | | | 439/218 |
| 9,531,118 B2 * | 12/2016 | Byrne | H01R 13/2421 |
| 9,583,897 B2 * | 2/2017 | Fargo | H01R 24/38 |
| 9,620,893 B2 * | 4/2017 | Kim | H01R 13/6205 |
| 9,678,537 B2 * | 6/2017 | Kupferstein | G06F 1/1632 |
| 9,838,085 B2 * | 12/2017 | Bosscher | H01R 13/665 |
| 2014/0044287 A1 | 2/2014 | Kim et al. | |
| 2014/0066138 A1 | 3/2014 | Kim | |
| 2014/0235075 A1 | 8/2014 | Kim et al. | |

* cited by examiner

THIN FILM TYPE MAGNETIC CONNECTOR MODULE

INCORPORATION BY REFERENCE OF ANY PRIORITY APPLICATIONS

This application is a continuation of U.S. patent application Ser. No. 14/948,724, filed on Nov. 23, 2015, which claims priority to Korean Patent Application No. 20-2014-0008618, filed on Nov. 25, 2014. The disclosures of the U.S. patent application Ser. No. 14/948,724 and the Korean Patent Application No. 20-2014-0008618 are incorporated herein by reference in their entireties.

BACKGROUND

Field

The disclosure generally relate to connector modules, and more particularly to magnetic connector modules.

Description of the Related Art

Various connectors are used to connect electronic devices to, e.g., supply power to the electronic devices and to transfer data to and between the electronic devices, and various types exist.

Many connectors employ insertion methods of connection between connection points, e.g., from a socket to an electronic device, e.g., portable electronic devices such as a smart phone, a tablet computer, etc. Many connectors also employ a wire between the connection points. Some of these connectors are often inconvenient to use because of the presence of the wire, and repeated usage of such connectors may cause damage to the connection points. For example, sockets can be damaged from repeated connecting and disconnecting processes. In addition, some connection points in portable electronic devices may add to the size and weight of the devices. Furthermore, while wireless connections may be suitable for some connection purposes, such as data communications, they may not be practical for other connection purposes, e.g., efficient and high speed power delivery. Thus, there is a need for connectors that do not suffer from these undesirable aspects of existing connectors such as wire-based connectors, while simultaneously not suffering from undesirable limitations of wireless connections.

SUMMARY

Various embodiments disclosed herein aim to solve the aforementioned problems of some of the existing connector technologies, by providing a thin magnetic connector module, and providing magnetic connector modules that can be connected easily to various devices. In some embodiments, the magnetic connector modules are thin film-type magnetic connector modules.

In order to resolve the aforementioned problems, in some embodiments, the thin film-type magnetic connector module, as a board capable of forming electrodes on the surface, is equipped with the aforementioned board with a concave section built internally, is equipped with electrode sections composed of multiple electrodes on the aforementioned other side of the board and the base surface, and includes: a board hole to connect the electrode sections at the base surface of the concave section and on the other side of the board; a magnet to be inserted into the aforementioned concave section; and a coating layer for insulating between the electrode sections built on the aforementioned magnet and the base surface.

The thin film-type magnetic connector module according some embodiments has a concave section is formed on one side of the aforementioned board, and can also include a connection socket connecting with the electrode section built on the aforementioned base surface.

Some embodiments of the thin film-type magnetic connector are built as a single body on the aforementioned board and can be expanded on one side of the board, and can also include a wing section that can be built separately from the board and attached to a single surface of the board.

In this instance, the wing section is made of metal materials and attached to the aforementioned board, and covers the magnet being inserted into the aforementioned concave section.

Also, the embodiments can include a metal plate that covers the magnet being inserted into the aforementioned wing section and the concave section.

Also, the aforementioned wing section is equipped with holes.

In this instance, the holes are equipped in order to create circumferential symmetry with the center of the aforementioned concave section being the center standard.

Also, the electrode section built on the other side of the aforementioned board is made up of pattern electrodes in a concentric circular shape.

In accordance with some embodiments, a magnet is inserted in the concave section on a surface on the board, and by forming an electrode section on the other side of the board, electric connection is made with an external device through magnetism between the aforementioned electrode section and the external socket section, and is able to provide a very thin magnetic connector module.

Also, in accordance with some embodiments, a wing section is built on one surface of the board, and by forming holes on the wing section; the thin film-type magnetic connector module disclosed herein is configured to be easily attached to various devices.

DETAILED DESCRIPTION OF THE PREFERRED EMBODIMENT

To address the aforementioned limitations of existing connector technologies, some technologies employ magnetic connectors.

In order to prevent this inconvenience and damage to the socket, magnetic connectors utilizing the magnetism is in development and use.

For example, in Korea Registered Patent No. 1,204,510, the pattern electrode section which is connected to the central hole of the device case is in a concentric circular shape on one side of the circular board, magnet no. 1 is internally located in the aforementioned pattern electrodes, and a spacer is equipped between the aforementioned pattern electrodes and the magnet no. 1.

Also, the brackets are equipped with pin sockets that make contact with the aforementioned pattern electrodes and the magnet no. 3 is located in the internals of the pin sockets, creating an electric connection between the aforementioned pattern electrodes and the pin sockets through magnetism between magnet no. 1 and magnet no. 3.

As detailed in such reference documents, the circular board on which the pattern electrodes are built, spacer and magnet no. 1 are applicable to the magnetic connector module used to supply power to mobile devices etc.

However, if the magnetic connector module is built as in the above reference document, the thickness of the connection module can only increase due to the width of the spacer and magnet no. 1, and as a result when connecting the magnetic connector module as detailed in the reference document with a device, limitations on the location of the device being connected in unavoidable.

Below various details of the magnetic connector module, e.g., a thin film-type magnetic connector module, in accordance with some embodiments will be explained through the drawings. The same reference numbers on the attached drawings specify the same component.

Figure 1:
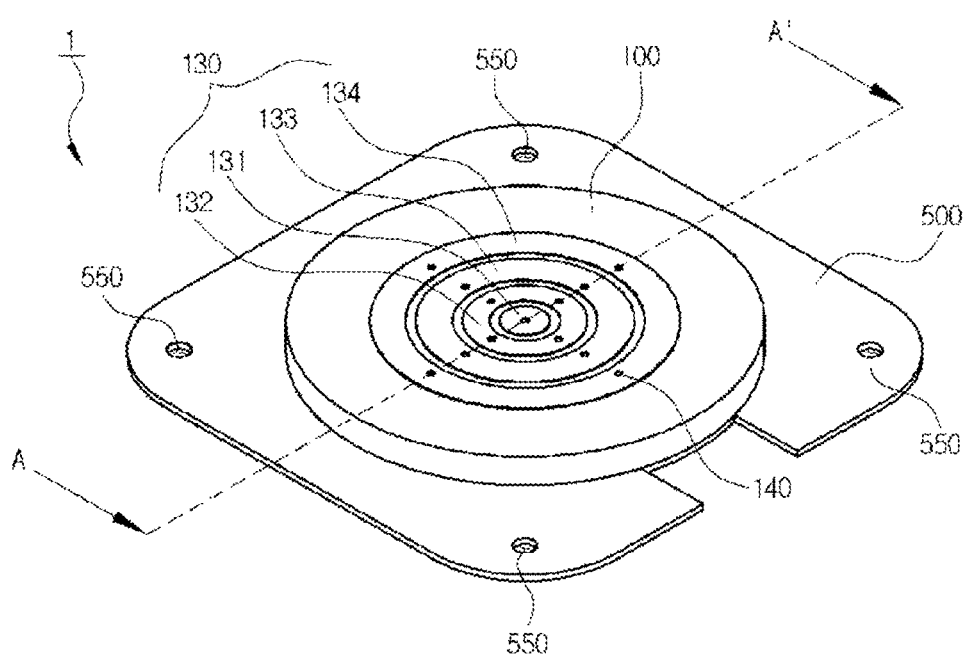
FIG. 1 is a perspective view of a thin film-type magnetic connector module according to various embodiments.
Figure 2A:
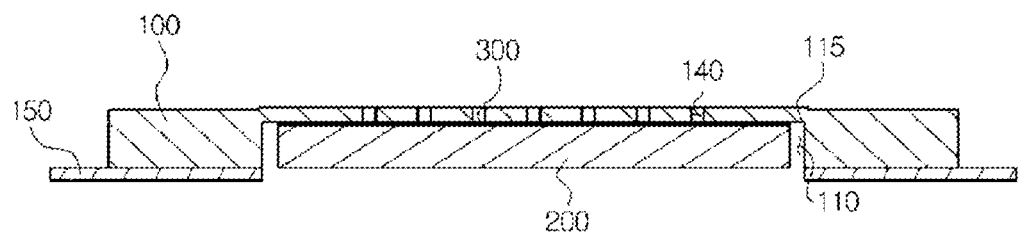
FIG. 2a is a cross-sectional view of a magnetic connector module according to some embodiments, where the cross-section is taken along line A-A' of a thin film-type magnetic connector illustrated in FIG. 1.
Figure 2B:
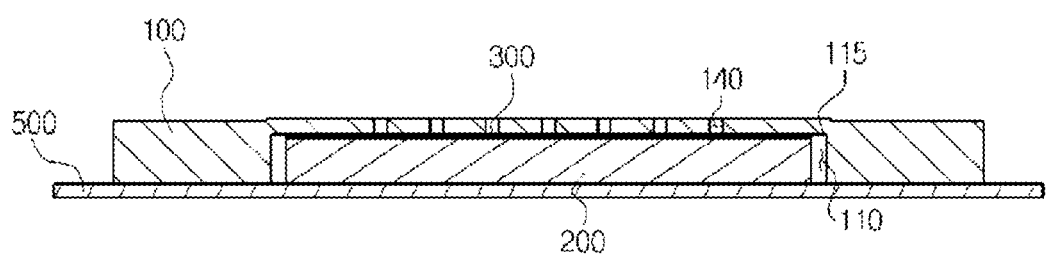
FIG. 2b is a cross-sectional view of a magnetic connector module according to some other embodiments, where the cross-section is taken along line A-A' of a thin film-type magnetic connector illustrated in FIG. 1.
Figure 2C:
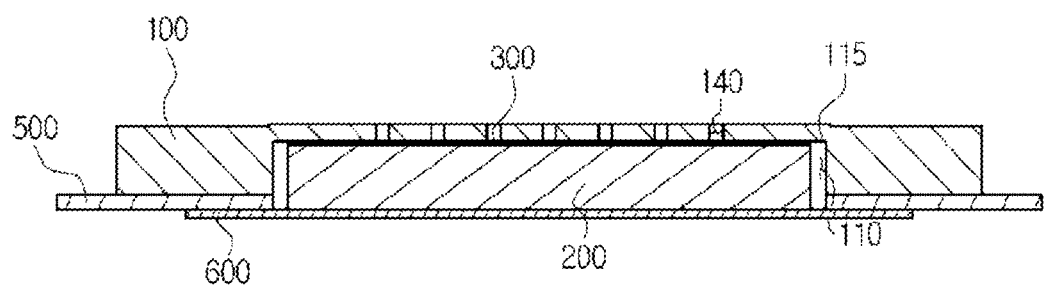
FIG. 2c is a cross-sectional view of a magnetic connector module according to yet other embodiments, where the cross-section is taken along a line A-A' of a thin film-type magnetic connector illustrated in FIG. 1.
Figure 3:
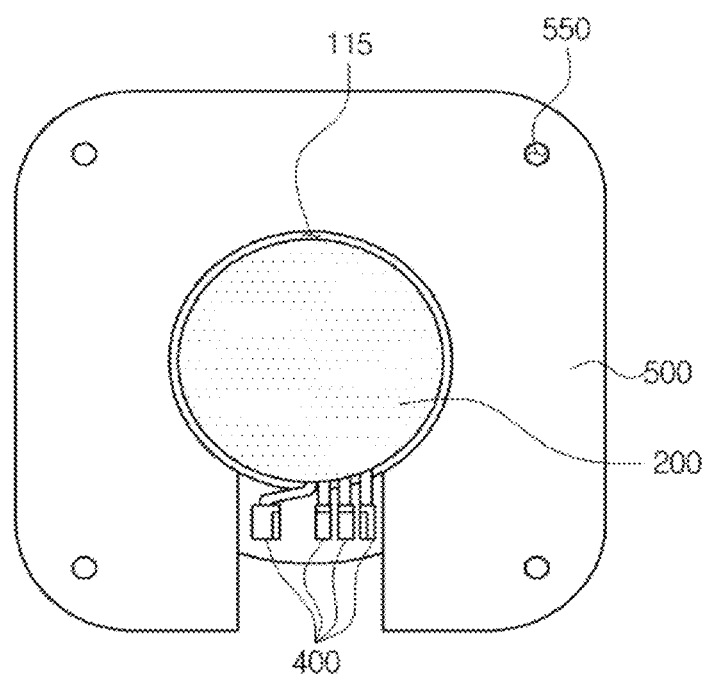
FIG. 3 is a top-down view of a first side of the thin film-type magnetic connector module of with the magnet inserted, according to some embodiments.
Figure 4:
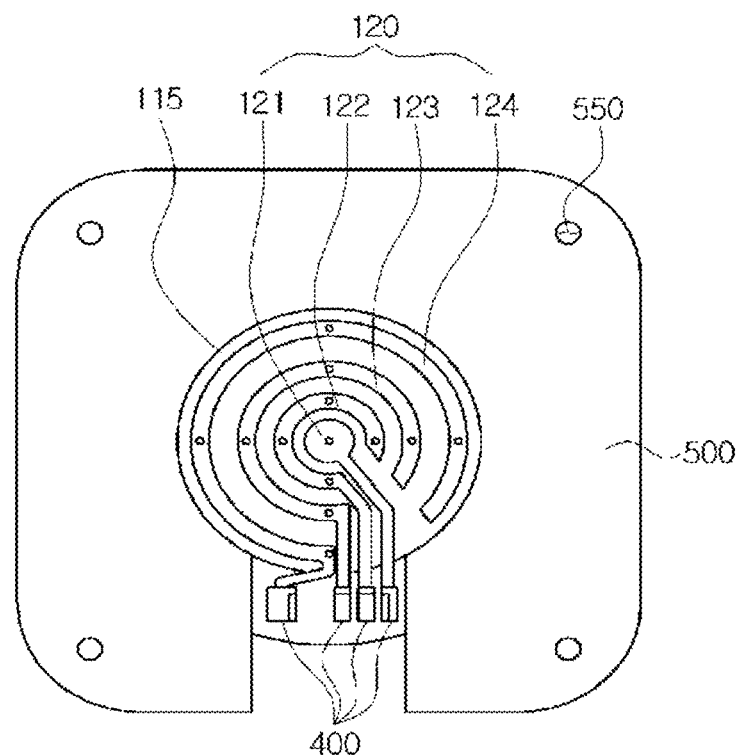
FIG. 4 a top-down view of a first side of the thin film-type magnetic connector module with the magnet removed, according to some embodiments.
Figure 5:
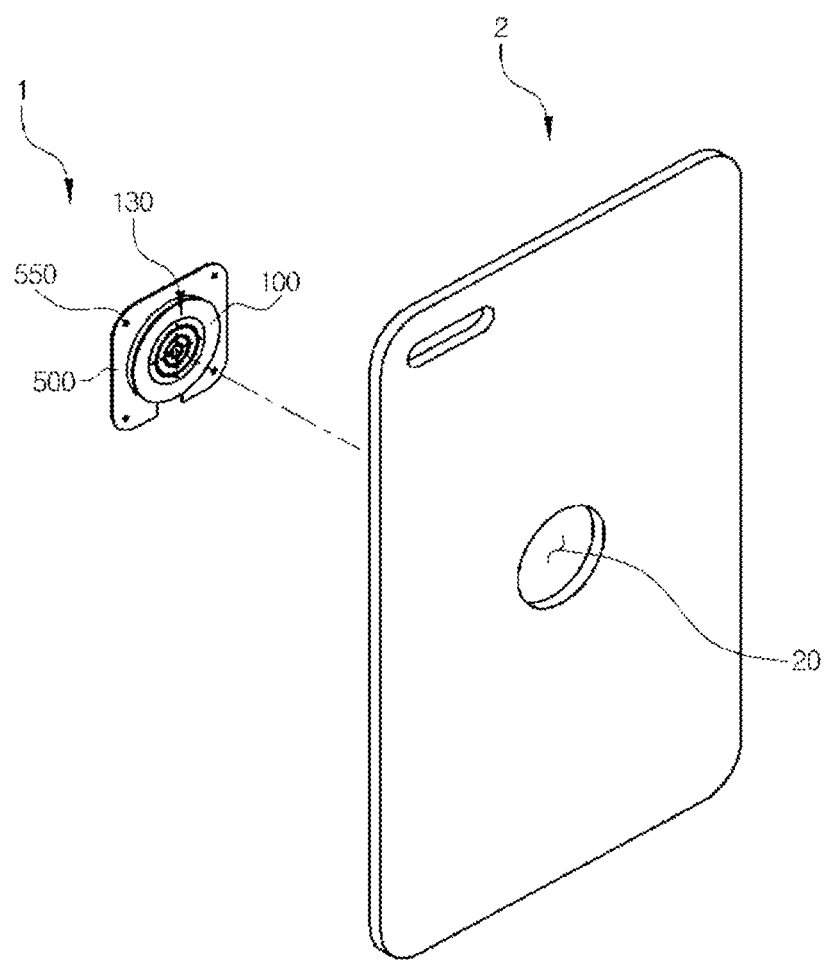
FIG. 5 is an illustration of a thin film-type magnetic connector module configured to be connected with a device case in operation, according to some embodiments.
Figure 6A:
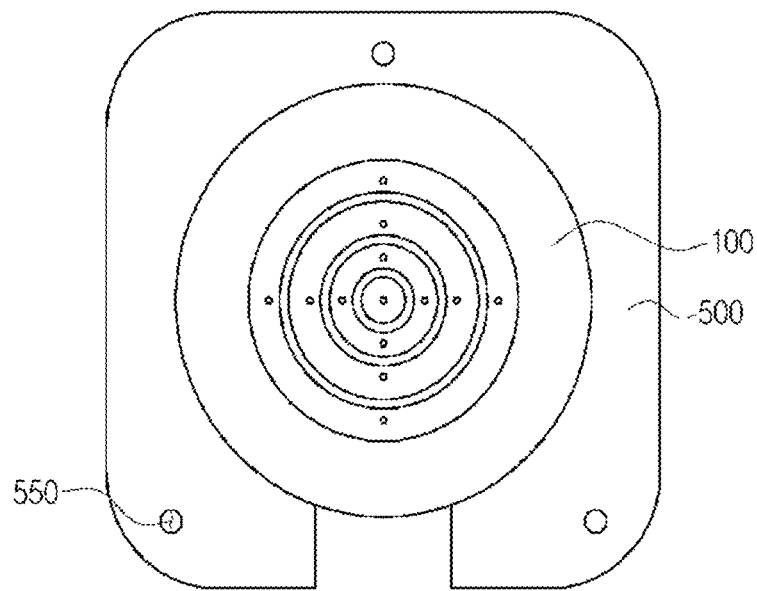
FIGS. 6a and 6b show different arrangements of holes formed through wing sections of magnetic connector modules in accordance with various embodiments.
Figure 6B:
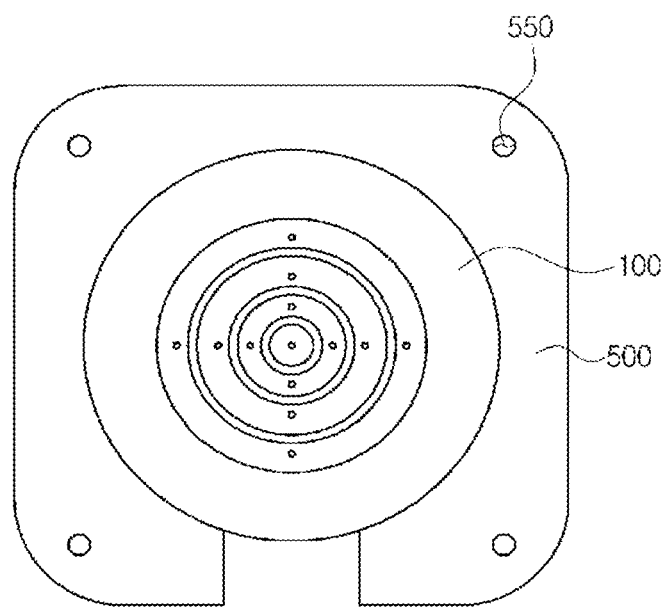
Figure 7:
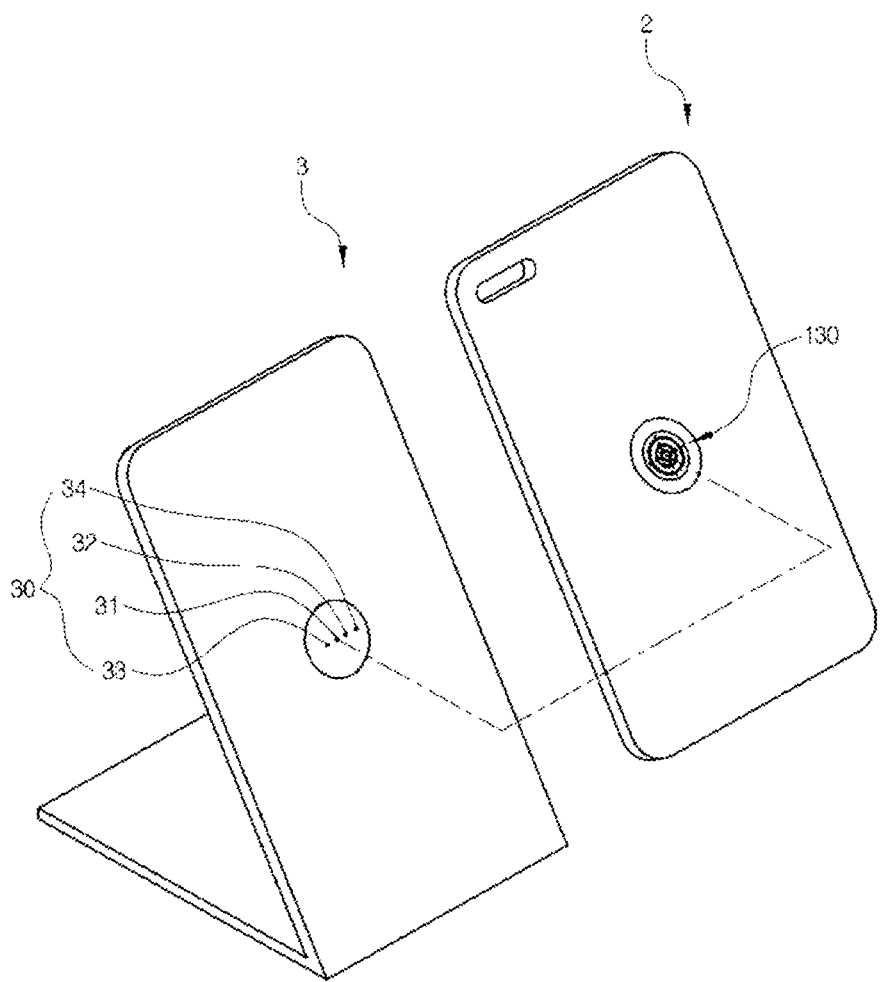
FIG. 7 is an operational illustration of an external socket section built on a surface of a device case and charging bracket that has been connected to the thin film-type magnetic connector module, according to embodiments.
Figure 8:
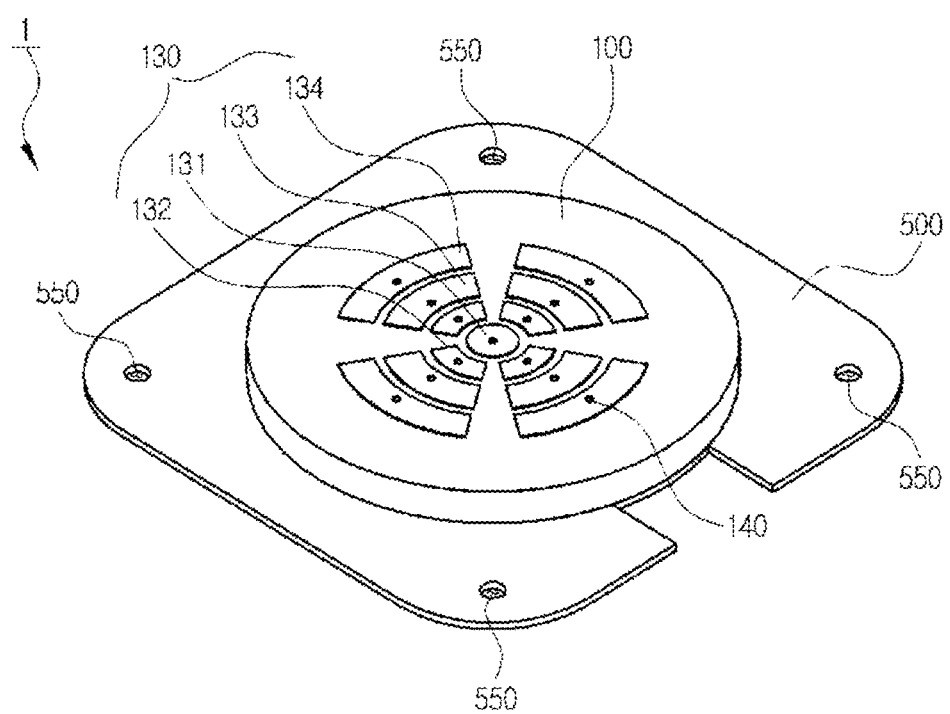
FIG. 8 is a perspective view of a thin film-type magnetic connector module according to some embodiments.

FIG. 1 is the blueprint of the structure of the thin film-type magnetic connector module in accordance with some embodiments, FIG. 2a is the first operational example of the cross-section of the thin film-type magnetic connector module divided by line A-A' on FIG. 1, FIG. 2b is the second operational example of the cross-section of the thin film-type magnetic connector module divided by line A-A' on FIG. 1, FIG. 2c is the third operational example of the cross-section of the thin film-type magnetic connector module divided by line A-A' on FIG. 1. FIG. 3 is the rear view of the thin film-type magnetic connector module's first operational example shown in FIG. 2a, FIG. 4 shows the electrode section on the base surface of the concave section in accordance with the operational example of some embodiments. FIG. 5 is an example drawing of the thin film-type magnetic connector module being connected with the device case in accordance with the operational example of some embodiments. FIGS. 6a and 6b shows the arrangement of holes located on the wing section in accordance with the operation example of some embodiments. FIG. 7 is an example drawing of the external socket section built on the surface of the device case and charging bracket that has been connected to the thin film-type magnetic connector module. FIG. 8 is the cross-section of a different operational example of the electrode section of the thin film-type magnetic connector module in accordance with some embodiments.

The operational examples of the thin film-type magnetic connector module 1 in accordance with some embodiments as shown in FIG. 1 to FIG. 4 include a board 100, a magnet 200 and a coating layer 300, and on one surface of the board 100 a connection socket section 400 and wing section 500 is formed for physical attachment to a back cover of mobile devices, device case etc. of various devices.

According to various embodiments, the board 100 is formed of a material suitable for forming electrodes, e.g., printed electrodes, on its surface, such as a substrate for a printed circuit board (PCB). Thus, a thin-film as described herein refers to a thickness comparable to or thinner than a printed circuit board (PCB) substrate.

One side of the board 100 is internally equipped with the concave section 110, and the magnet 200 is inserted into the aforementioned concave section 110. In the illustrated embodiment, the opposite side of the board 100 is planar. In some embodiments, only one magnet 200 is inserted. In other embodiments, a plurality of magnets can be inserted. In some embodiments, the magnet 200 is substantially flat and circular, e.g., coin-shaped, and has a thickness smaller than the board 100, which can be, e.g., a PCB board.

Referring to FIGS. 1-4, the base surface 115 of the concave section 110 on one side of the board 100 is equipped with an electrode section 120 comprising multiple electrodes 121~124, and the other side of the board 100 is likewise equipped with an electrode section 130 comprising multiple electrodes 131~134.

By way of example, the electrode section 130 built on the other side of the board can include one or more a power socket (131(e.g., v+), 134(e.g., GND)) and a data socket (132(e.g., D+), 133(e.g., D−)), and the electrode section 120 on the base surface can include a power socket (121(e.g., v+), 124(e.g., GND)) and a data socket (122(e.g., D+), 123(e.g., D−)). The power socket (131, 134) and the data socket (132, 133) of the electrode section 130 correspond to the power socket (121, 124) and the data socket (122, 123) of the electrode section 120. However, it will be appreciated that the sockets forming electrode sections 120 and 130 are not limited to a power socket and a data socket, and can be equipped with other sockets, e.g., SIG sockets used to check contact with an external socket section, among other sockets.

According to the attached drawings, both the electrode section 130 equipped on the other side of the board 100 and the electrode section 120 on the base surface 115 is shown in the shape of a concentric circle, but the electrode sections 120 and 130 can be built in various shapes and the electrode sections 120 and 130 do not need to be identical in shape.

The board 100 is equipped with a board hole 140 used to electrically connect the electrode sections 120 and 130 built on the other side of the board 100 and on the base surface 115.

The board hole 140 is created more than once on electrodes 131~134 located on the electrode section 130 on the other side of the board 100, and is penetrated up to electrodes 121~124 composing the electrode section 120 on the base surface 115.

Also, the inside of the board holes 140 have conductors formed through, e.g., coated or filled with a conductive material, such that the electrode sections 120 and 130, formed on each the base surface 115 and the other side of the board 100, respectively, are electrically connected to each other.

At this instance, the electrode section 120 built on the base surface 115 can be connected to the connection socket section 400 built on one side of the board 100, as shown in FIG. 4. Each socket in the connection socket section 400 can be connected to the lead wire (not shown), and through such connection sockets 400 the connection between the lead wire and the electrode section 120 can be achieved easily.

As one way some of the present embodiments can be used, FIG. 5 shows an example of the connector module 1 being connected with a device case 2, e.g., a back cover of a mobile device, e.g., a smart phone, and more specifically the drawing shows after forming a penetration hole 20 in the center of the device case 2 it can be used as a connector to the mobile device by attaching the connector module 1 to the aforementioned penetration hole 20.

After the connector module 1 is connected with the device case 2 in accordance with the embodiments, it is desirable for there to be minimum topography resulting from height differences, on either side of the device case 2. Thus, in various embodiments, the thickness of the board 100 is substantially similar or the same as the thickness of the device case 2. Thus, in some embodiments, at least one surface of the connector module 1 (e.g., the surface corresponding to the electrode section 130) is flush against the corresponding surface of the case 2. That is, the surface of the board 100 having the electrode section 130 forms a substantially coplanar surface with an external surface of the case 2

However, FIG. 5 just shows one operational form of the connector module 1 connecting with the device case 2, and the connector module 1 can be connected to various other devices.

As shown in FIG. 5, when connecting the connector module 1 with the device case 2, in accordance with the board 100 being inserted into the penetration hole 20 on the device case 2, the wing section 500 is pressed up against one side of the device case 2 and can be used to fasten the connector module 1 on the device case 2.

The wing section 500 in the attached drawings is shown as a square shape with rounded corners, but the wing section 500 is not limited in its shape and can be built as a rectangular or circular shape.

In some embodiments, the wing section 500 can be formed as an integral piece which expands from one side of the board 100 by modifying (e.g., deforming to form the concave section) the board 100 when building the connector module 1. In these embodiments, the wing section 500 and the board 100 is formed of the same material, e.g., a PCB substrate.

In some other embodiments, the wing section 500 can be formed separately and attached afterwards. When formed separately and attached to the board 100 afterwards, the wing section 500 can be formed of a material different from the board, including, e.g., plastic, alloy, metal, etc.

On the other hand, FIG. 2 is the first operational example of the cross-section of the thin film-type magnetic connector module divided by line A-A' of FIG. 1, and according to this figure the wing section 500 is equipped on one side of the board 100, but it is not shown to be equipped on the concave section 110 where the magnet 200 is located.

However, as shown in the second operational example showing the cross-section of the connector module in FIG. 2b, the wing section 500 can be built to cover the magnet 200 inserted into the concave section 110.

Because the board 100 according to embodiments are configured to receive the magnet 200 into the concave section 110 built on one side of the board 100, it is preferable to have a magnet that is thin, and therefore there may be a need to strengthen the magnetic coupling force of the magnet 200, or to increase the are over which the magnetic coupling force is exerted.

As one suggestion in strengthening the magnetism of the magnet, the wing section 500, made of metallic materials, could be attached to one side of the board 100 and as shown in FIG. 2b, the wing section 500 could be made to cover the magnet 200 inserted into the concave section 110.

And in this instance, the area of the wing section 500 closest to one side of the magnet 200 becomes larger than the area of the coating layer 300 closet to the other side of the magnet 200 or the area of the base surface 115. The magnetic flux density of the magnet 200 is inversely proportional to the area of the side which the magnet 200 is the closest; the magnetic flux density from the magnet 200 to the other side of the circuit 100 will become greater than the magnetic flux density from the magnet 200 to the wing section 500.

Therefore, in the case of the metallic wing section 500 covering the magnet 200 inserted into the concave section 110, compared to when it does not cover the magnet 200 inserted into the concave section 110 as shown in FIG. 2a, the magnetism of the magnet 200 in the direction from the magnet 200 to the other side of the circuit 100 will become stronger.

Also, in another suggestion in strengthening the magnetism of the magnet 200, by pressing a separate metallic sheet 600 against the lower area of the wing section 500 as shown in FIG. 2c, the wing section 500 can be made to cover the magnet 200 inserted into the concave section 110.

Similarly, when additionally adding a metallic sheet 600 to cover the magnet 200 inserted into the concave section 110, compared to FIG. 2a where there is no metallic sheet, the magnetism of the magnet 200 directed from the magnet 200 to the other side of the board 100 will become stronger, and in this instance, the metallic sheet 600 does not need to cover the whole area of the wing section 500.

In some embodiments, the magnet 200 has a thickness, the concave section 110 of the board 100 has a depth, and the wing section 500 has a thickness such that the magnet 200 does not protrude above an outer major surface of the wing section 500.

However, because the magnetic flux density from the magnet 200 to the other side of the board 100 increases as the area of the metallic sheet 600 increases, the area of the metallic sheet must be determined with the magnetism strength needed by the connector module 1 in consideration. Also, in order to avoid the thicknesses of the connector module 1 increasing, it is desirable that the metallic sheet be in the form of a thin film.

In addition, to achieve easy connection from the connection socket 400 built on one side of the board 100 to the lead wire, a gap in the wing section 500 where the connection socket 400 is located may be created.

Also, the wing section 500 may be built with multiple hole 550 in order to fasten the connector module 1 to the device case 2.

As shown in FIG. 5, in the case of connecting the connector module 1 to the device case 2, the wing section 500 will be pressed up against one side of the device case 2. In this instance, the connector module 1 can be attached to the device case 2 through coating the wing section 500 of the connector module 1 with adhesives or installing screws or bolts through hole 550. In addition, the connector module 1 can be fastened to the device case 2 by forming projections (not shown) on one side of the device case 2 and inserting them into the multiple hole 550, then by fusing the said projections.

In the case of fastening the connector module 1 with the device case 2 by a single hole 550 located on the wing section 500, the connector module 1 and the device case 2 cannot be connected properly. Therefore it is desirable to form multiple hole 550 on the wing section 500.

At this instance, it is desirable for the multiple hole 550 in the wing section 500 to be symmetrical at the circumference with the center of the concave section 110 built on one side of the board 100 as the standard.

For example, in the case shown in FIG. 6*a*, if there are 3 hole 550 in the wing section 500, they should be created at 120° with the concave section 110 as the center standard, and in the case shown in FIG. 6*b*, where there are 4 hole 550 in the wing section 500, they should be created at 90° with the concave section 110 as the center standard.

Similarly, if multiple hole 550 are created with circumferential symmetry with the center of the concave section 110 as the center standard, the strength received from the device case 2 when fastening the connector module 1 by the multiple hole 550 can be distributed evenly, resulting in a stable connection between the connector module 1 and the device case 2.

FIG. 7 is an example drawing of the external socket section built on the surface of the device case and charging bracket that has been connected to the thin film-type magnetic connector module.

The electrode section 130 built on the other side of the board 100 is, as shown in FIG. 7, built on the same side as the rear side of the device case 2, electrically connecting with contact by magnetism from the external socket section 30 equipped on an external device.

In this instance, the external device referred to with reference to some embodiments refers to a device capable of supplying external power to the connection module 1 such as the charging bracket 3 shown in FIG. 7, and the external socket section 30 refers to an external socket that can connect electrically on contact by the magnetism from the electrode section 130 equipped on the aforementioned external device.

As mentioned before, the electrode section 130 can be composed of power socket 131(V+), 134(GND) and the data socket 132(D+), 133(D−).

In this instance, the external socket 30 can be composed of power socket 31(V+), 34(GND) and the data socket 32(D+), 33(D−) corresponding to the above electrode section 130, and in order for the electrode section 130 to magnetically connect with the external socket 30, a separate magnet (not shown) is disposed inside the external socket 30. Thus, the external socket 30 and the electrode section 130 are configured to be held in direct physical contact by the magnetic force between then.

Additionally, regarding the shape of the electrode section 130, although the attached blueprint show the electrode section 130 as composed of pattern electrodes 131~134 in a concentric circular shape, the said pattern electrodes 131~134 do not have to be built in a concentric circular pattern, and is capable of being patterned into all shapes, as long as the patterning is consistent, e.g., laterally symmetric.

However, even if the concentric circular pattern electrodes 131~134 are rotated to a random direction, the electric connection with the corresponding external socket 30 is maintained.

In this instance, the concept of the concentric circular pattern electrodes 131~134 includes the scenario of not only forming a continuous circular pattern, but also forming a non-continuous circular pattern as shown in FIG. 8. However, non-continuous pattern electrodes 131~134 is limited in rotating the connector module 1 during the magnetic contact of the electrode section 130 and the external socket 30 through some embodiments, as well as after the contact.

Additionally, it is desirable that the external socket 30 that is magnetically connected to the concentric circular pattern electrodes 131~134 be an external pin socket equipped with pins on the external device, but it is not limited to this.

However, in the case of the external socket section being an external pin socket, a section of the external pin socket projects externally through the holes created on the charging bracket 3, and is positioned to be corresponding 1:1 to the aforementioned concentric circular pattern electrodes 131~134.

The magnet 200 is inserted into the concave section 110 built on one side of the board 100, and magnetically attaches the electrode section 130 on the other side of the board 100 with the external socket 30 built on the external device, creating an electric connection between the two.

Similarly, by inserting the magnet 200 to the concave section 110 built on one side of the board 100 and equipping an electrode section 130 on the other side of the board 100, a thin film-type magnetic connector module, the purpose of some embodiments, can be provided.

In this instance, it is desirable that the thickness of the magnet 200 being inserted into the concave section 110 is not greater than the depth from the base surface 115 to one side of the board 100 or from the base surface 115 to the wing section 500, but it can be greater in order to strengthen the magnetism of the magnet 200.

However, in the case where the magnet 200 is too thick, for example during the connection of the device case 2 on the mobile device as shown in FIG. 7, the connection with the device may prove difficult due to the magnet 200, and even after connecting, a gap between the device case 2 and the mobile device is created. Therefore, the thickness of the magnet 200 should be determined with the magnetic power needed by the connector module 1 and the operational structure of the connector module 1 in consideration.

Additionally, the coating layer is created on the base surface 115 of the concave section 110.

Because an electrode section 120 is built on the base surface 115 of the concave section 110, when the magnet 200 is inserted into the concave section 110 an electric short occurs between the multiple electrodes 121-124 that composes the electrode section 120.

Therefore, in order to prevent an electrical short, some embodiments of the present disclosure include a coating layer 300 to provide electrical insulation between the magnet 200 and the electrode section 120.

In this instance, the coating layer 300 can be created by coating the base surface 115 of the concave section 110 or by coating the magnet 200.

The present invention is not limited to operation examples, has various applications, and without breaking from the key points of the present invention of which claim has been requested, anyone with general knowledge in the field of the present invention can perform various modifications.

REFERENCE NUMBER EXPLANATION

1: Thin Type Magnetic Connector Module
100: board

110: concave section
115: base surface of concave section
120: electrode section built on the base surface
130: electrode section built on one side of the board
140: board hole
200: magnet
300: coating layer
400: connection socket section
500: wing section
550: hole
600: metallic sheet

What is claimed is:

1. A magnetic connector module, comprising:
a board having a cavity configured to accommodate a magnet therein, wherein the board has a plurality of holes formed therethrough;
a first pattern of electrodes formed on an inner surface of the cavity and a second pattern of electrodes formed on an outer surface of the cavity facing away from the inner surface; and
conductors formed in the plurality of holes,
wherein the first pattern of electrodes and the second pattern of electrodes are electrically connected by the conductors formed in the plurality of holes.

2. The magnetic connector module of claim 1, wherein the holes are filled with the conductors.

3. The magnetic connector of claim 1, further comprising an electrically insulating layer formed over the first pattern of electrodes and configured to electrically insulate the first pattern of electrodes from the magnet when accommodated in the cavity.

4. The magnetic connector of claim 1, wherein the board comprises a printed circuit board (PCB) substrate, and wherein one or both of the first pattern and the second pattern comprise a printed electrode pattern.

5. The magnetic connector of claim 1, the second pattern comprises radially symmetric electrodes.

6. The magnetic connector of claim 5, wherein the second pattern comprises concentric circles.

7. The magnetic connector of claim 5, wherein the second pattern comprises a plurality of spaced apart concentric arcs.

8. The magnetic connector of claim 5, wherein the plurality of holes are linearly arranged in a lateral direction.

9. The magnetic connector of claim 8, wherein each of the radially symmetric electrodes are contacted by one or more of the conductors formed in the plurality of holes.

10. The magnetic connector of claim 1, further comprising a connection socket formed on the first side of the board and electrically connected to the first pattern of electrodes, wherein the connection socket is configured to electrically connect to an electronic device.

11. The magnetic connector of claim 1, further comprising the magnet, wherein the magnet is accommodated in the cavity.

12. The magnetic connector of claim 11, wherein the magnet has a cylindrical shape having a height smaller than a depth of the cavity.

13. A magnetic connector system, comprising:
a magnetic connector module comprising:
a board having a cavity accommodating a magnet therein, wherein the board has a plurality of holes formed therethrough,
a first pattern of electrodes formed on an inner surface of the cavity and a second pattern of electrodes formed on an outer surface of the cavity facing away from the inner side, and
conductors formed in the plurality of holes,
wherein the first pattern and the second pattern are electrically connected by the conductors formed in the plurality of holes; and
a socket module having a socket module surface configured to physically couple to the magnetic connector module via a magnetic force from the magnet, the socket module having plurality of conductive pins formed on the socket module surface. configured to electrically couple to the magnetic connector module.

14. The magnetic connector system of claim 13, wherein the plurality of conductive pins of the socket module are linearly arranged in a lateral direction.

15. The magnetic connector of claim 14, wherein the second pattern of electrodes comprises concentric circles, and wherein each of the conductive pins are configured to remain in electrical contact with a corresponding one of the concentric circles when the magnetic connector is coupled to the socket module and rotated about a central axis of the concentric circles.

16. The magnetic connector of claim 14, wherein the second pattern of electrodes comprises a plurality of disconnected concentric arcs, and wherein each of the conductive pins are configured to remain in electrical contact with a corresponding one of the concentric arcs within an angle defined by the corresponding one of the concentric arcs when the magnetic connector is coupled to the socket module and rotated about a central axis of the concentric arcs.

17. A device, comprising:
a device case having an opening formed therethrough; and
a magnetic connector module having a portion configured to be inserted through the opening, the magnetic connector module comprising:
a board having a cavity configured to accommodate one or more magnets therein, wherein the board has a plurality of holes formed therethrough,
a first pattern of electrodes formed on an inner surface of the cavity and a second pattern of electrodes formed on an outer surface of the cavity facing away from the inner surface, and
conductors formed in the plurality of holes,
wherein the first pattern and the second pattern are electrically connected by the conductors formed in the plurality of holes.

18. The device case assembly of claim 17, wherein the magnetic connector module comprises a planar portion formed outside of the cavity of the board, wherein the planar portion extends laterally outward beyond side surfaces of the board such that when the magnetic connector is inserted through the opening, the planar portion stops the magnetic connector module from passing through the hole.

19. The device case assembly of claim 18, wherein the board has a thickness such that, when fully inserted into the opening, the board forms a substantially coplanar surface with an external surface of the device casing.

* * * * *

UNITED STATES PATENT AND TRADEMARK OFFICE
CERTIFICATE OF CORRECTION

PATENT NO. : 9,960,532 B2
APPLICATION NO. : 15/483487
DATED : May 1, 2018
INVENTOR(S) : Hyun-Jun Kim et al.

It is certified that error appears in the above-identified patent and that said Letters Patent is hereby corrected as shown below:

On the Title Page

Column 1, Notice, Line 3, after "0 days." delete "days.".

In the Specification

Column 5, Line 31, change "2" to --2.--.

Column 7, Line 56, change "then." to --them.--.

Column 8, Line 48, change "121-124" to --121~124--.

In the Claims

Column 10, Line 14 (approx.), in Claim 13, change "surface." to --surface--.

Signed and Sealed this
Eleventh Day of December, 2018

Andrei Iancu
*Director of the United States Patent and Trademark Office*